(12) United States Patent
Noguchi et al.

(10) Patent No.: US 6,936,769 B1
(45) Date of Patent: Aug. 30, 2005

(54) ELECTRONIC PART MOUNTING SUBSTRATE, ELECTRONIC PART, AND SEMICONDUCTOR DEVICE

(75) Inventors: Takashi Noguchi, Tokyo (JP); Masahiro Machida, Tokyo (JP); Makoto Terui, Yamanashi (JP); Yuichi Deushi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/960,721

(22) Filed: Oct. 8, 2004

(30) Foreign Application Priority Data

Feb. 12, 2004 (JP) .............................. 2004-034709

(51) Int. Cl.[7] .............................. H05K 5/00; H02G 3/08
(52) U.S. Cl. ...................... 174/52.1; 174/260; 174/264
(58) Field of Search .............................. 174/52.1, 52.2, 174/52.4, 260, 264

(56) References Cited

U.S. PATENT DOCUMENTS

| | | | |
|---|---|---|---|
| 6,555,208 B2 * | 4/2003 | Takada et al. | 428/209 |
| 6,555,762 B2 * | 4/2003 | Appelt et al. | 174/264 |
| 2004/0211594 A1 * | 10/2004 | Ho et al. | 174/264 |
| 2004/0238211 A1 * | 12/2004 | Momokawa et al. | 174/260 |

FOREIGN PATENT DOCUMENTS

| | | |
|---|---|---|
| JP | 10-125834 | 5/1998 |
| JP | 10-279845 | 10/1998 |
| JP | 11-067998 | 3/1999 |

* cited by examiner

*Primary Examiner*—Hung V. Ngo
(74) *Attorney, Agent, or Firm*—Rabin & Berdo, P.C

(57) ABSTRACT

An infrared emissive first insulating portion, which radiates heat transferred from a WCSP corresponding to an electronic part to a first conductive portion as infrared radiation with high efficiency, is formed on the first conductive portion lying in a through hole provided in a printed wiring board with the WCSP mounted thereon.

16 Claims, 8 Drawing Sheets

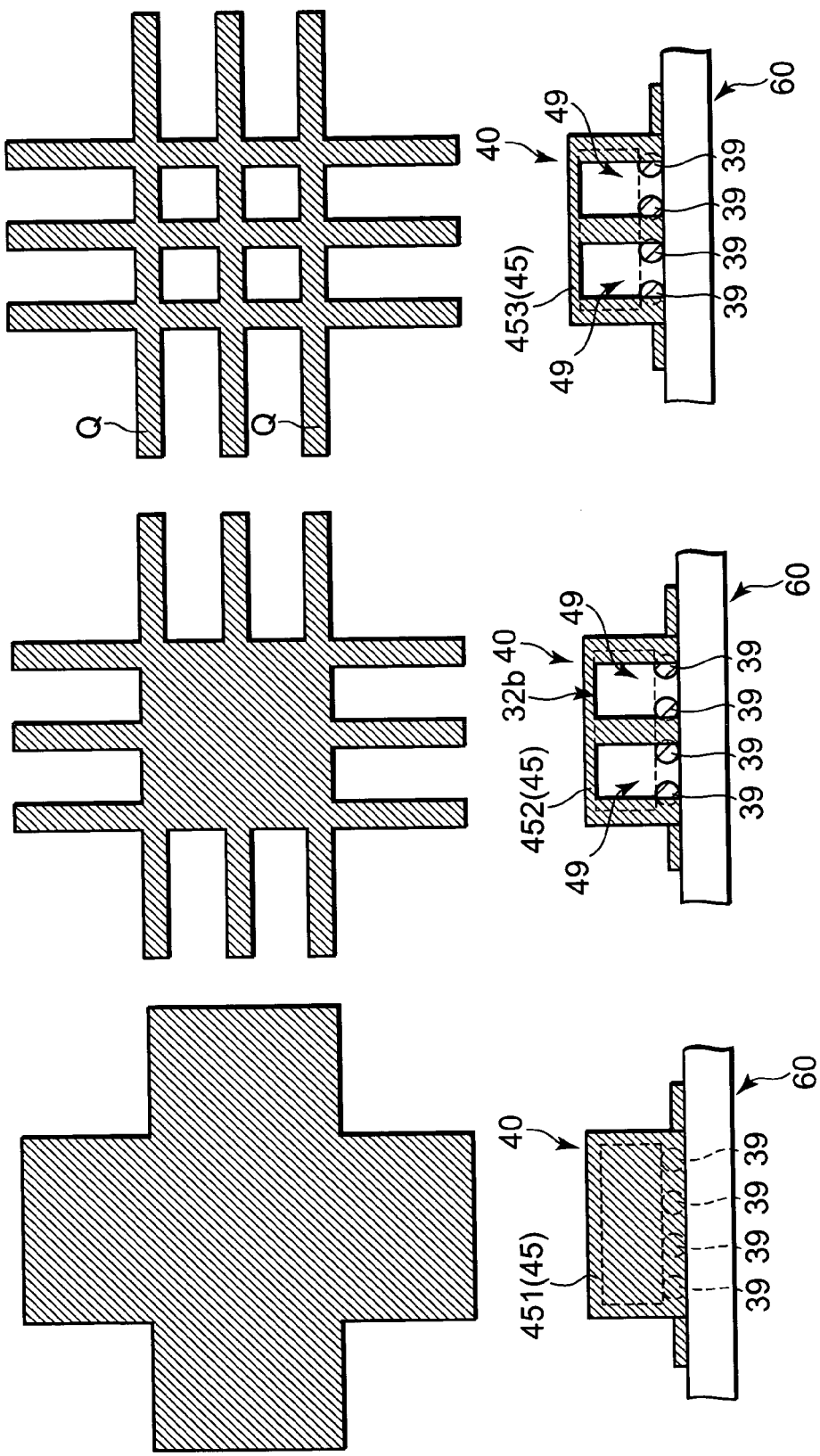

ELECTRONIC PART MOUNTING SUBSTRATE, ELECTRONIC PART, AND SEMICONDUCTOR DEVICE

BACKGROUND OF THE INVENTION

1. Field of the Invention

The present invention relates to an electronic part mounting substrate, an electronic part, and a semiconductor device in which an electronic part is mounted on an electronic part mounting substrate.

This application is counterpart of Japanese patent application, Serial No. 34709/2004, filed Feb. 12, 2004, the subject matter of which is incorporated herein by reference.

2. Description of the Related Art

The development of a technique for radiating heat produced from an electronic part to the outside with high efficiency has heretofore been pursued in the field of an electrical apparatus.

Thus, a technique for providing a heat radiating part and a resin high in thermal conductivity on a chip has been known as the technique for heat radiation (see, for example, the following patent document 1).

There is also known a technique for providing a film for improving thermal emissivity on a chip or a substrate (see, for example, the following patent document 2).

Patent Document 1

Japanese Laid Open Patent Application No. 10-125834

Patent Document 2

Japanese Laid Open Patent Application No. 11-67998

However, the patent document 1 merely discloses that a material high in thermal conductivity is adopted as a material for heat radiation.

Thus, such a configuration is not enough to radiate heat transferred from the chip into the air with satisfactory efficiency. There is a fear that heat transferred from the chip to the substrate in particular is accumulated inside the substrate, so that the heat is not radiated into the air efficiently.

Although the patent document 2 has disclosed that the film high in thermal emissivity is provided on the substrate, a specific discussion about a heat transfer path from the chip to the film has not yet been made. Therefore, there is room for improvement if consideration is given to the fact that the heat is radiated into the air more efficiently. There is a fear that heat is accumulated in a heat transfer path set up to attainment of heat produced in the chip to the film in particular.

SUMMARY OF THE INVENTION

Therefore, a principal object of the present invention is to provide an electronic part mounting substrate capable of efficiently radiating heat produced from an electronic part such as a chip to the outside, an electronic part and a semiconductor device in which an electronic part is mounted on an electronic part mounting substrate.

According to one aspect of the present invention, there is provided a substrate for mounting an electronic part thereon, which includes a base body having a first main surface and a second main surface opposite to the first main surface, and a through hole which penetrates from the first main surface to the second main surface; a first conductive portion formed on an inner wall surface of the through hole; and a first insulating portion which is formed on the first conductive portion and higher in thermal emissivity than the first conductive portion.

According to the electronic part mounting substrate of the present invention, an insulating portion higher in thermal emissivity than a conductive portion formed on an inner wall surface of a through hole defined in the substrate is formed on the conductive portion.

As a result, an insulating portion excellent in thermal emission, which is provided on a first conductive portion, promotes the high-efficiency radiation of heat transferred from an electronic part used as a heat generation source to the first conductive portion to the outside.

Thus, an excellent heat radiating effect can be realized by use of the through hole defined in the substrate without additionally mounting a radiating part such as a radiating fin.

According to another aspect of the present invention, there is provided a semiconductor device which includes a base body having a first main surface and a second main surface opposite to the first main surface, and a through hole which penetrates from the first main surface to the second main surface; a first conductive portion formed on an inner wall surface of the through hole; second conductive portion formed on the first main surface and the second main surface so as to be connected to the first conductive portion; an electronic part mounted on the first main surface, said electronic part being electrically connected to the second conductive portion formed on the first main surface; a first insulating portion which is formed on the first conductive portion and higher in thermal emissivity than the first conductive portion; and an external terminal formed on the second conductive portion provided on the second main surface.

According to still another aspect of the present invention, there is provided an electronic part, mounted on a main surface of a substrate for mounting the electronic part thereon, which includes: a protruded conductive portions respectively electrically connected to conductive portions formed on the main surface of the substrate; and an auxiliary conductive portion which extends from a surface of the electronic part different from a surface thereof on which the protruded conductive portions are formed, to the main surface of the substrate, said auxiliary conductive portion having a length provided in the extending direction, which is set as a length at which face contact with the main surface of the substrate is enabled upon mounting of the electronic part.

According to still another aspect of the present invention, there is provided a semiconductor device which includes a substrate for mounting an electronic part thereon; and said electronic part mounted on a main surface of the substrate, said electronic part including, protruded conductive portions respectively electrically connected to conductive portions formed on the main surface of the substrate; and an auxiliary conductive portion which extends from a surface of the electronic part different from a surface thereof on which the protruded conductive portions are formed, to the main surface of the substrate, said auxiliary conductive portion having a length provided in the extending direction, which is set as a length at which face contact with the main surface of the substrate is enabled upon mounting of the electronic part.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 7 is a view (part 1) for describing metal support sections employed in the third embodiment of the present invention.

DETAILED DESCRIPTION OF THE PREFERRED EMBODIMENTS

Figure 1:
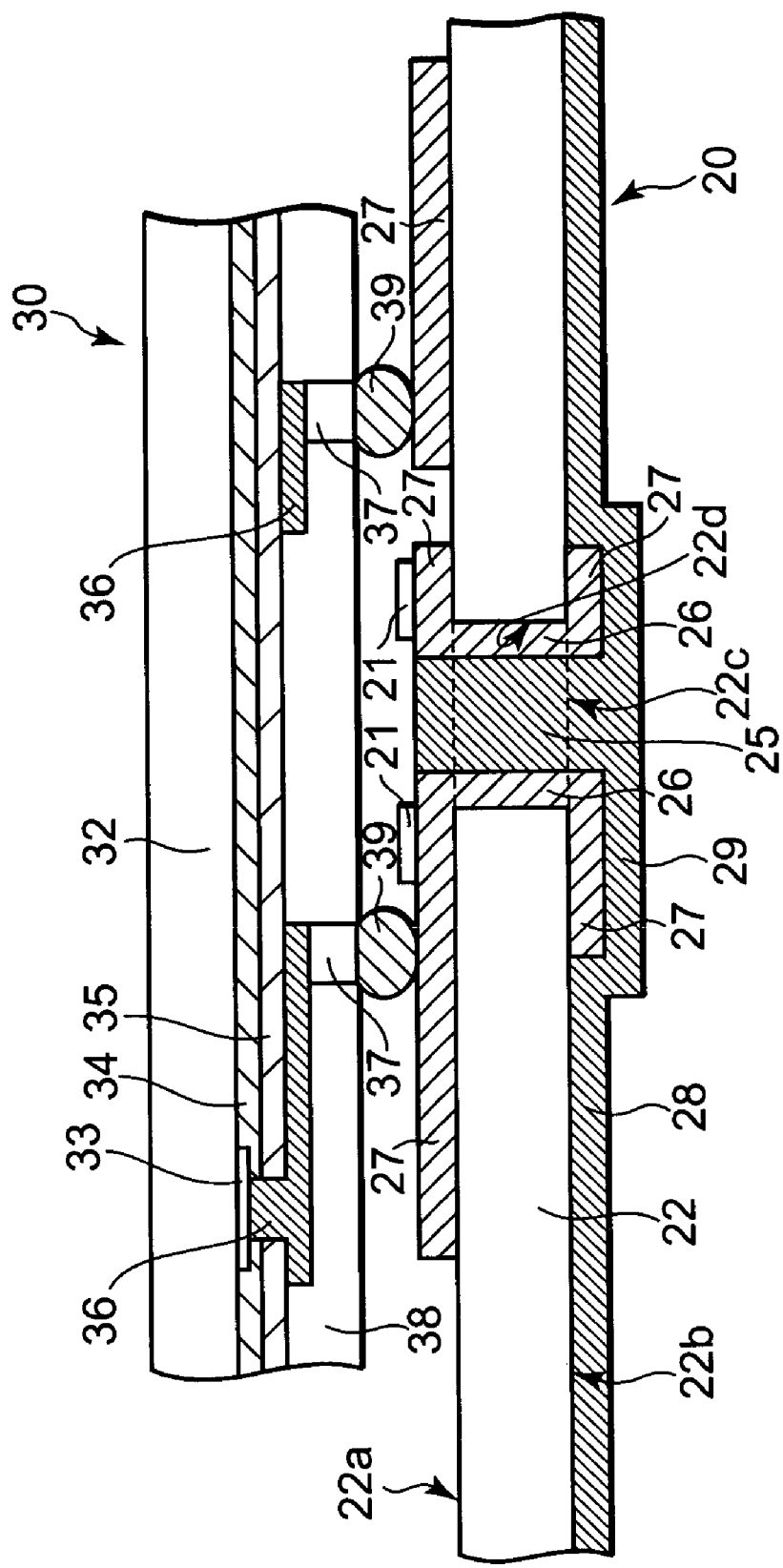
FIG. 1 is a schematic cross-sectional view for describing a first embodiment of the present invention.

Preferred embodiments of the present invention will hereinafter be described with reference to FIGS. 1 through 8. Incidentally, the drawings merely schematically show the size, shape and positional relationships of respective components to such a degree that the present invention can be understood. Thus, the present invention is by no means limited to the illustrated examples. In order to make it easy to understand the drawings, some hatching indicative of cross-sections are omitted except for parts. Incidentally, embodiments to be described below are simply preferred examples and illustrated numerical conditions are by no means limited to them. Similar components illustrated in the respective drawings are respectively identified by the same reference numerals, and the description of certain common components might be omitted.

First Embodiment

FIG. 1 is a schematic cross-sectional view showing a packaging structure on which an electronic part or component used as a heat generation source according to the present embodiment is mounted (or called also "packaged"). The present embodiment will explain, as an example, a case in which the electronic component used as the heat generation source is configured as a WCSP (Waterlevel Chip Size Package) 30 corresponding to a semiconductor package having substantially the same outer size as that of a semiconductor chip, and a heat radiation mechanism is provided in a printed wiring board 20. Incidentally, the term "substantially the same" means that such a configuration that the outer size of the package assumes a size increased up to about 20% with respect to the outer size of the semiconductor chip as well as such a configuration that the outer size of the package is just the same size as the outer size of the semiconductor chip.

Of CSP having a package size substantially identical to the outer size of the semiconductor chip, the WCSP is called one of those fractionalized by dicing or the like after the completion of all up to an external terminal forming process while remaining in a wafer state. The printed wiring board is called one in which on the basis of predetermined circuit design, conductor patterns are formed on the surface of an insulating base material or conductor wirings are formed on the surface thereof and thereinside by patterning. Incidentally, a BGA (Ball Grid Array) or the like may be used as an electronic part mounted over the printed wiring board 20. This can be selected suitably at random.

As shown in FIG. 1, the WCSP 30 is mounted over the printed wiring board 20. Described specifically, second conductive portion 27 provided in the printed wiring board 20 and solder balls 39 each corresponding to a first protruded conductive portion are electrically connected to one another in contact with one another.

The WCSP 30 corresponding to the electronic part will first be explained. Since the conventionally known structure can be applied to the WCSP 30 used herein, its structure example will be explained below in brief.

As shown in FIG. 1, a passivation film 34 and a protective film 35 are sequentially provided on a semiconductor chip 32 provided with circuit elements (not shown) so as to expose the surface of each of electrode pads 33 each electrically connected to its corresponding circuit element. The passivation film 34 is formed of, for example, a silicon oxide film ($SiO_2$). The protective film 35 is formed of a film material low in hardness such as a polyimide resin and suppresses shock against the semiconductor chip 32 and peeling due to stress between the semiconductor chip 32 and an encapsulating or sealing film 38 to be described later. Wiring layers (called also "redistribution wiring layers") 36 respectively extend in the direction of the center of the semiconductor chip 32 over the protective film 35. The electrode pads 33 are electrically individually connected to their corresponding post portions 37 through the wiring layers 36. The solder balls 39 corresponding to the protruded conductive portions, which are formed on their corresponding end faces (or top faces) of the post portions 37, can be relocated from positions directly above the electrode pads 33 to desired positions on the upper side of the semiconductor chip 32 by means of the wiring layers 36.

The printed wiring board 20 with the WCSP 30 mounted thereon will be explained subsequently.

In the printed wiring board 20 employed in the present embodiment, as shown in FIG. 1, the second conductive portions 27 are formed by patterning on the obverse and reverse surfaces of a glass epoxy base material 22 used as a base body, i.e., a first main surface 22a and a second main surface 22b. The second conductive portions 27 are respectively conductor wirings made of copper foil (Cu).

An extend-through hole (called also "viaholes or through holes") 22c, which extends or penetrates between the obverse and reverse surfaces (22a and 22b) of the base material 22, is defined in the base material 22 of the printed wiring board 20. A first conductive portion 26 is formed on an inner wall surface 22d of the through hole so as to be continuous with its corresponding second conductive portions 27. The first conductive portion 26 serves as a thermal via portion which shares the use of a conductor wiring. As shown in FIG. 1, stoppers 21 may be formed of a resist material or the like at the peripheral edge of the through hole 22c on the second conductive portion 27 connected to its corresponding solder ball 39. The stoppers 21 have the function of preventing solder to flow into the through hole 22c upon mounting of the WCSP 30.

The first conductive portion 26 can be provided by forming the through hole (indicates by a dotted line in FIG. 1) 22c in the base material 22 with a drill or the like and thereafter forming and providing copper on the inner wall surface 22d by plating. The formation of the first conductive portion 26 is performed before the second conductive portions 27 are formed on the surface layer of the base material 22 by patterning.

Incidentally, the first conductive portion 26 and its corresponding solder ball 39 may be configured so as to be directly connected to each other. However, owing to the placement of the solder ball 39 on the second conductive portion 27 as shown in FIG. 1, alignment accuracy at the mounting of the WCSP 30 can preferably be relaxed. Since the second conductive portion 27 is formed over the second main surface 22b as well as inside the through hole 22c as in the present configurational example, heat can preferably be transferred to the back surface 22b of the printed wiring board 20 reliably in terms of thermal radiation.

In the present embodiment, its principal feature resides in that a first insulating portion 25 higher in thermal emissivity than the first conductive portion 26 is formed on the first conductive portion 26 lying in the through hole 22c.

In the present embodiment, the first insulating portion 25 higher in thermal emissivity than the first conductive portion has such a structure as to fill up the interior of a hollow portion defined by the first conductive portion 26 formed on the inner wall surface of the through hole 22c.

For instance, a coating material containing ceramics may preferably be used as the material for the first insulating portion 25. This is used because the coating material containing ceramics has a high thermal emissivity of 90% or more in most cases as well as thermal conduction and is capable of realizing high-efficiency heat radiation. Described specifically, alumina ceramics or the like containing $Al_2O_3$ as a major component can be used. One or the like containing such ceramics as described in, for example, Japanese Laid Open Patent Application No. 10-279845 can be suitably used at random. Ceramics or the like added with black pigments for improving the thermal emissivity may be used.

When the heat radiation is carried out by only the first conductive portion 26 that shares the use of the thermal via portion (inclusive of such a structure that the first conductive portion 26 fills up the interior of the through hole 22c), a rise in the ambient temperature around the thermal via portion due to heat transfer by convention is unavoidable.

Since, however, the first insulating portion 25 is provided as in the present embodiment, the heat transferred from the WCSP 30 to the first conductive portion 26 can be thermally radiated (or called also "emitted") from the first insulating portion 25 to the outside as infrared radiation.

As a result, the rise in the ambient temperature around the thermal via portion 26 can be suppressed and efficient thermal radiation can be realized.

Described specifically, thermal conductivity and thermal emissivity at the time that the through hole 22c is filled with only copper used for the first conductive portion 26, are respectively given as about 137W/m·K and about 0.03. On the other hand, as in the present configurational example, thermal conductivity and thermal emissivity in the case of such a configuration that the through hole 22c is filled with the alumina ceramics used for the first insulating portion 25, reach about 161W/m·K and about 0.92 respectively.

Owing to the provision of the first insulating portion in the through hole 22c, as is apparent from this point of view, the heat transferred from the electronic part such as the chip can efficiently be radiated outside.

Incidentally, the first insulating portion 25 may be formed on the first conductive portion 26 lying in the through hole 22c with a predetermined film thickness. As in the present configurational example, however, a heat radiating effect can preferably be further promoted by filling up the through hole 22c with the first insulating portion 25, i.e., embedding the first insulating portion 25 in the through hole 22c.

In the present embodiment, a second insulating portion 28 higher in thermal emissivity that the first conductive portion 26 is formed on the second main surface 22b, and a third insulating portion 29 higher in thermal emissivity than the first conductive portion 26 is formed on the second main surface 22b with the second conductive portion 27 interposed therebetween. These are formed so as to be continuous with the first insulating portion 25. Thus, higher-efficiency heat radiation can be realized. Incidentally, each of the second and third insulating portions (28 and 29) used here is also a coating material containing ceramics in a manner similar to the first insulating portion 25.

Such first, second and third insulating portions (25, 28 and 29) can be formed by, for example, applying a liquid infrared-emissive insulator coating material to a predetermined area by a spray method and thermally curing it.

From the above description, the printed wiring board 20 employed in the present embodiment combines a function used as a wiring board and a function used as an excellent radiating plate, which makes it possible to carry out high-efficiency heat radiation by the infrared emissive insulator.

Subsequently, the verification of the radiating effect of the printed wiring board 20 having the above-described structure was done by measuring a "thermal resistance value ($\theta$ja)" used as an index of the radiating effect.

A summary of a method of measuring thermal resistance values where electronic parts are set as a WCSP 30 and a BGA 50, will first be explained with reference to FIG. 2.

Figure 2A:
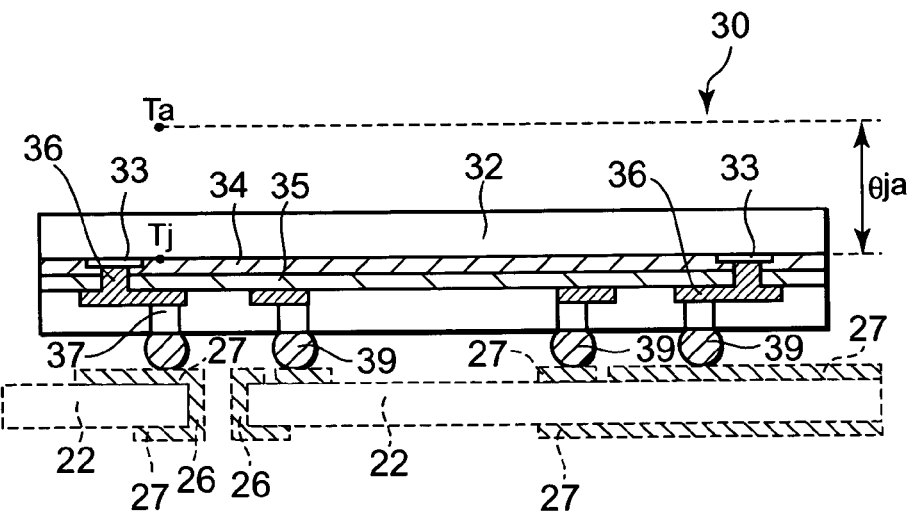
FIG. 2 is a schematic view (part 1) for describing the outline of a method of measuring a thermal resistance value, according to the first embodiment of the present invention.

FIG. 2(A) is a schematic view for describing a summary of the method of measuring the thermal resistance value where the electronic part is configured as the WCSP 30. The P-VFLGA48-0606-0.8 manufactured by Oki Electric Industry Co., Ltd. was used as for the WCSP 30 used here. Incidentally, since the structure of the WCSP 30 is substantially identical to the already-described WCSP 30, the description thereof will be omitted. In the present embodiment, the temperature at the boundary between the semiconductor chip 32 and the passivation film 34 bonded to the semiconductor chip 32 was set as a junction temperature (Tj), and the temperature at a position spaced a predetermined distance away from the WCSP 30 was set as a reference point temperature (Ta).

Figure 2B:
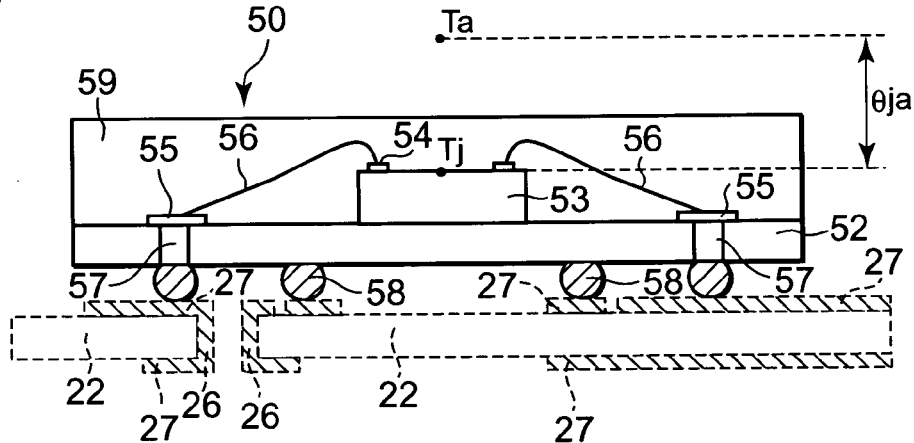

FIG. 2(B) is a schematic cross-sectional view for describing the summary of the method of measuring the thermal resistance value where the electronic part is configured as the BGA 50. The P-BGA352-3535-1.27 manufactured by Oki Electric Industry Co., Ltd. was used as for the BGA 50 used here. Incidentally, since the structure of the BGA 50 is substantially similar to the conventional known wire bonding system, its structure will be explained below in brief.

As shown in FIG. 2(B), a semiconductor chip 53 is mounted on an insulated board 52 with a circuit element (not shown) forming surface set as the upper side. Electrode pads 54 connected to their corresponding circuit elements are connected to their corresponding conductor patterns 55 on the insulated board 52 by wires 56. Thus, a predetermined circuit element is electrically connected to its corresponding solder ball 58 corresponding to an external terminal via a contact 57 provided so as to penetrate between the obverse and reverse surfaces of the insulated board 52. A resin sealing or encapsulating film 59, which buries and seals the semiconductor chip 53, is formed on the insulated board 52.

The semiconductor patterns 55 shown here are formed of copper and the wires 56 are formed of gold (Au). In the present embodiment, the temperature at the boundary between the semiconductor chip 53 and the resin encapsulating film 59 bonded to the semiconductor chip 53 was set as a junction temperature (Tj), and the temperature at a position spaced a predetermined distance away from the BGA 50 was set as a reference point temperature (Ta).

A specific method of measuring a thermal resistance value will be explained subsequently with reference to FIG. 2(C).

Figure 2C:
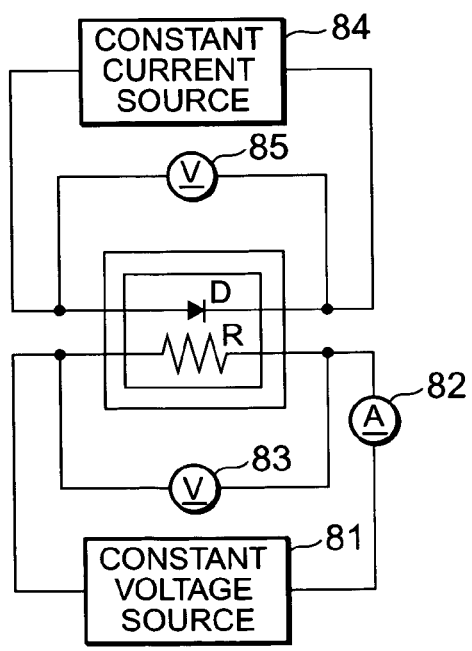

As shown in FIG. 2(C), a constant voltage power supply 81 applies a power of 1W to a resistor R provided in the neighborhood of a position where a junction temperature (Tj) of each of the semiconductor chips (32 and 53) is measured, to thereby generate heat, whereby a thermal saturated state (or called also "thermal equilibrium state") is formed. Incidentally, the constant voltage power supply 81 is fine-adjusted by reference to an ammeter 82 and a voltmeter 83 to supply the power (1W).

Then, a constant current power supply 84 is activated to cause current to flow in a diode D provided in the semiconductor chip near the resistor R, and a voltage value obtained at this time is measured by the voltmeter 85, whereby the above junction temperature (Tj) is calculated. A reference point temperature (Ta) is measured by means of a thermocouple (not shown) or the like.

Further, in the present configurational example, measuring samples different in the insulating portion forming area were prepared to examine the influence of infrared emissive insulating portions on thermal resistance values as shown in FIG. 3. Although a description will be made of a case in which an electronic part is set as a WCSP, BGA is also similar to it.

Figure 3A:
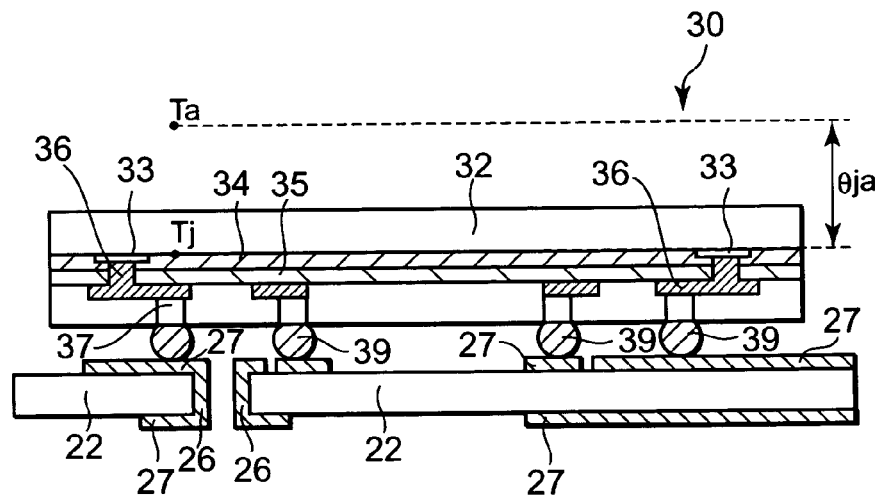
FIG. 3 is a schematic view (part 2) for describing the outline of the method of measuring the thermal resistance value, according to the first embodiment of the present invention.

Sample (1): no infrared emissive insulating portion is formed (see FIG. 3(A)). Incidentally, the sample (1) might be called plank (1) below.

Figure 3B:
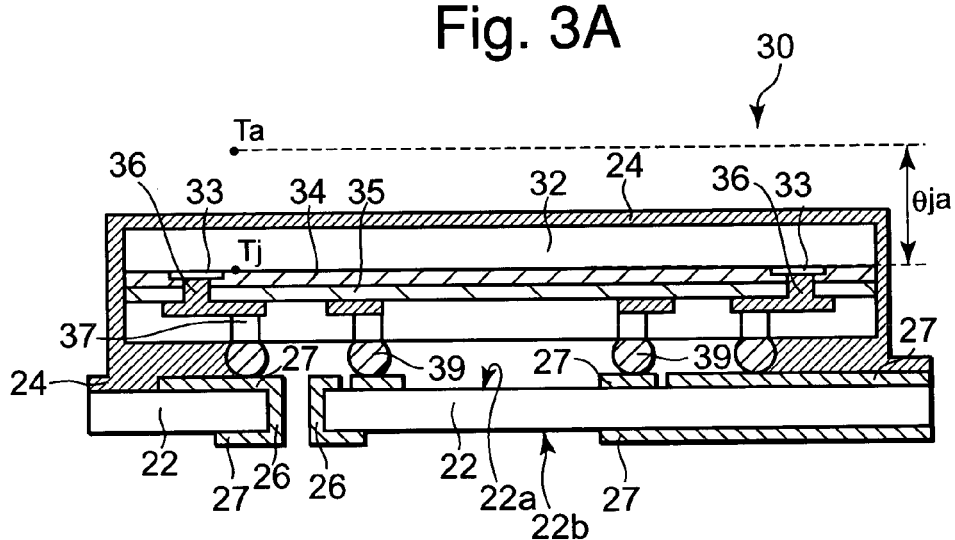

Sample (2): an infrared emissive fourth insulating portion 24 is formed from the whole surface of a WCSP to over a first main surface 22a (see FIG. 3(B)). Incidentally, the insulating portion is set to a thickness of about $1 \times 10^{-4}$ m at this time.

Figure 3C:
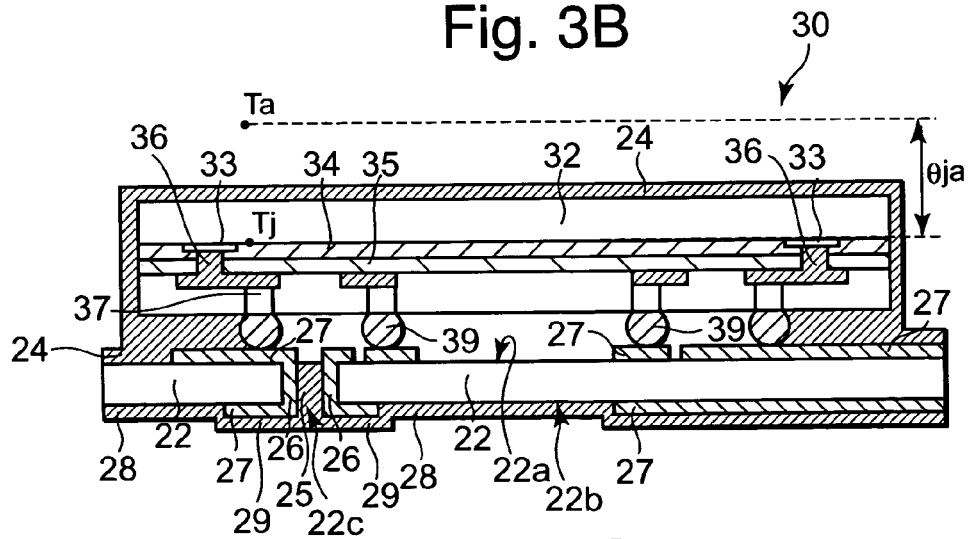

Sample (3): infrared emissive first through third insulating portions (25, 28 and 29) are formed on a second main surface 22b and inside a through hole 22c in addition to the area described in the sample (2) (see FIG. 3(C)). Incidentally, the insulating portions are set to a thickness of about $1 \times 10^{-4}$ m and the corresponding insulating portion is charged into the through hole 22c.

A thermal resistance value θja can be calculated from the following expression (1) according to the various parameters obtained in this way:

$$\theta ja[°C./W] = (Tj - Ta)[°C.]/\text{Power}[W] \quad (1)$$

Incidentally, the method of measuring the thermal resistance value is not limited to only the above methods. Measurement conditions for the parameters (Tj and Ta) are set based on, for example, JEDEC (Joint Electron Device Engineering Council) standard or the like. In addition, arbitrary and suitable methods and measurement conditions can be selected according to purpose and design.

Figure 4A:
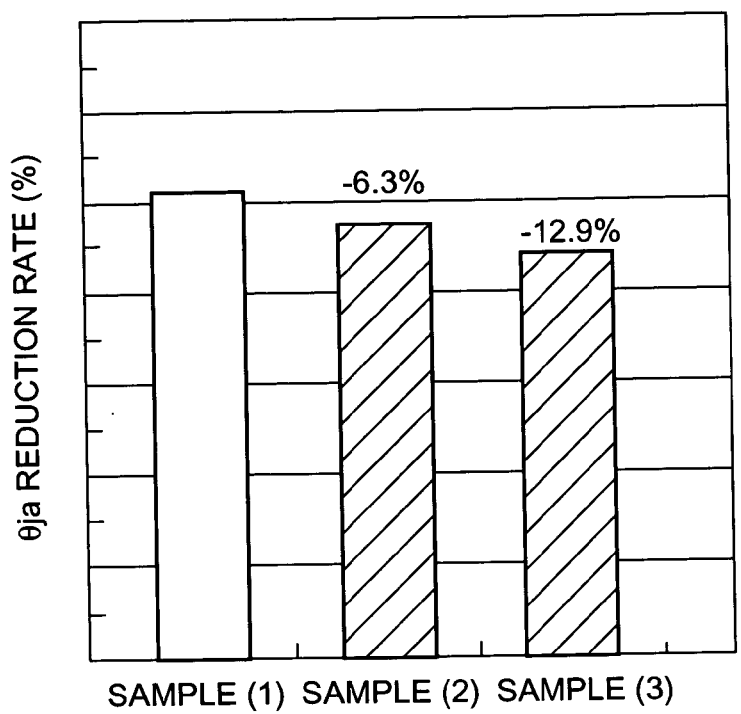
FIG. 4 is a view showing the result of measurement of thermal resistance values, which is obtained in the first embodiment of the present invention.
Figure 4B:
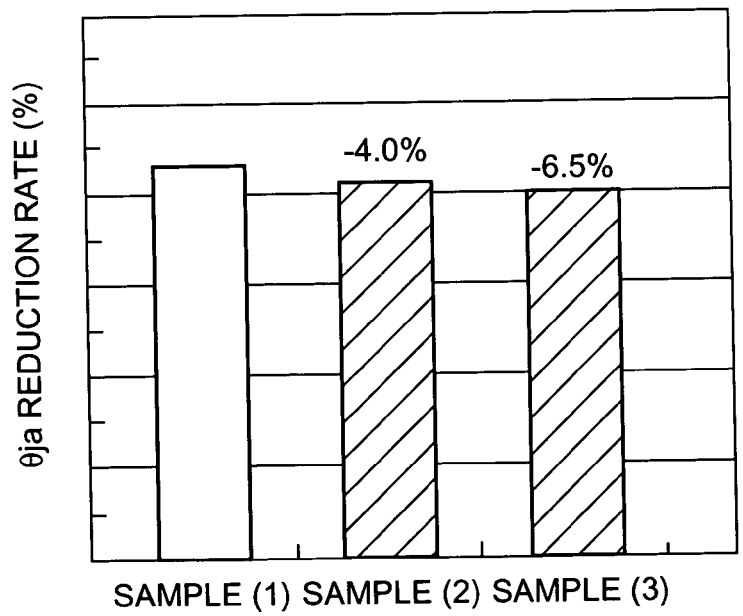

FIG. 4 shows the result of measurement of thermal resistance values θja. FIG. 4(A) is the result of measurement thereof where the electronic part is set as a WCSP, and FIG. 4(B) is the result of measurement thereof where the electronic part is set as a BGA. In the present embodiment, thermal resistance values placed under respective conditions with the thermal resistance value of the plank (1) as a reference value are illustrated as bar graphs. Further, reduction rates (%) relative to the thermal resistance value of the plank (1) are described together in addition.

It was confirmed from the results of measurements shown in FIGS. 4(A) and 4(B) that even when the electronic part was either the WCSP or the BGA, the thermal resistance values were respectively reduced at rates of 6.3% to 12.9% and 4.0% to 6.5% owing to the provision of the infrared emissive insulating portions.

It is understood from this point of view that an improvement in the efficiency of thermal radiation of the electronic part can be realized without additionally mounting a radiating part such as a radiating fin.

Judging from the result of the sample (2), a satisfactory heat radiating effect can be obtained even by the structure that the whole surface of the electronic part is covered with the corresponding infrared emissive insulating portion. It was further confirmed that a heat radiating effect was further promoted owing to the provision of the same insulating portion on the conductive portion in the through hole and the back surface of the board as in the sample (3).

According to the present embodiment as is apparent from the above description, an insulating portion higher in thermal emissivity than a conductive portion is formed on the conductive portion formed on an inner wall surface of a through hole defined in a printed wiring board or the like on which an electronic part is mounted.

As a result, heat transferred from the electronic part to the insulating portion via the conductive portion can be highly efficiently radiated from the insulating portion as infrared radiation. Therefore, a heat radiating effect can be promoted without additionally mounting a radiating part such as a radiating fin.

Second Embodiment

A second embodiment of the present invention will be explained with reference to FIG. 5.

While the infrared emissive insulating portions for promoting the heat radiating effect are being formed on the substrate for the motherboard with the package mounted thereon in the first embodiment, the present embodiment is principally different from the first embodiment in that infrared emissive insulating portions similar to those employed in the first embodiment are formed on an interposer board packageable on the substrate for the motherboard, and a heat radiating insulating portion is formed on the whole surface of the interposer board so as to cover an outer surface of an electronic part or component. Incidentally, the same elements of structure as those already described in the first embodiment are respectively identified by the same reference numerals, and their specific description will therefore be omitted (respective embodiments to be described below are also similar).

The present embodiment will explain, as an example, a board or substrate for an MCM (Multi Chip Module) as a package's interposer board. The MCM is one obtained by mounting, for example, a plurality of packages and their peripheral parts and the like on one high density board and bringing them into module form. Incidentally, one having a structure with a bare chip mounted thereon is included in MCM boards in addition to the above.

Figure 5:
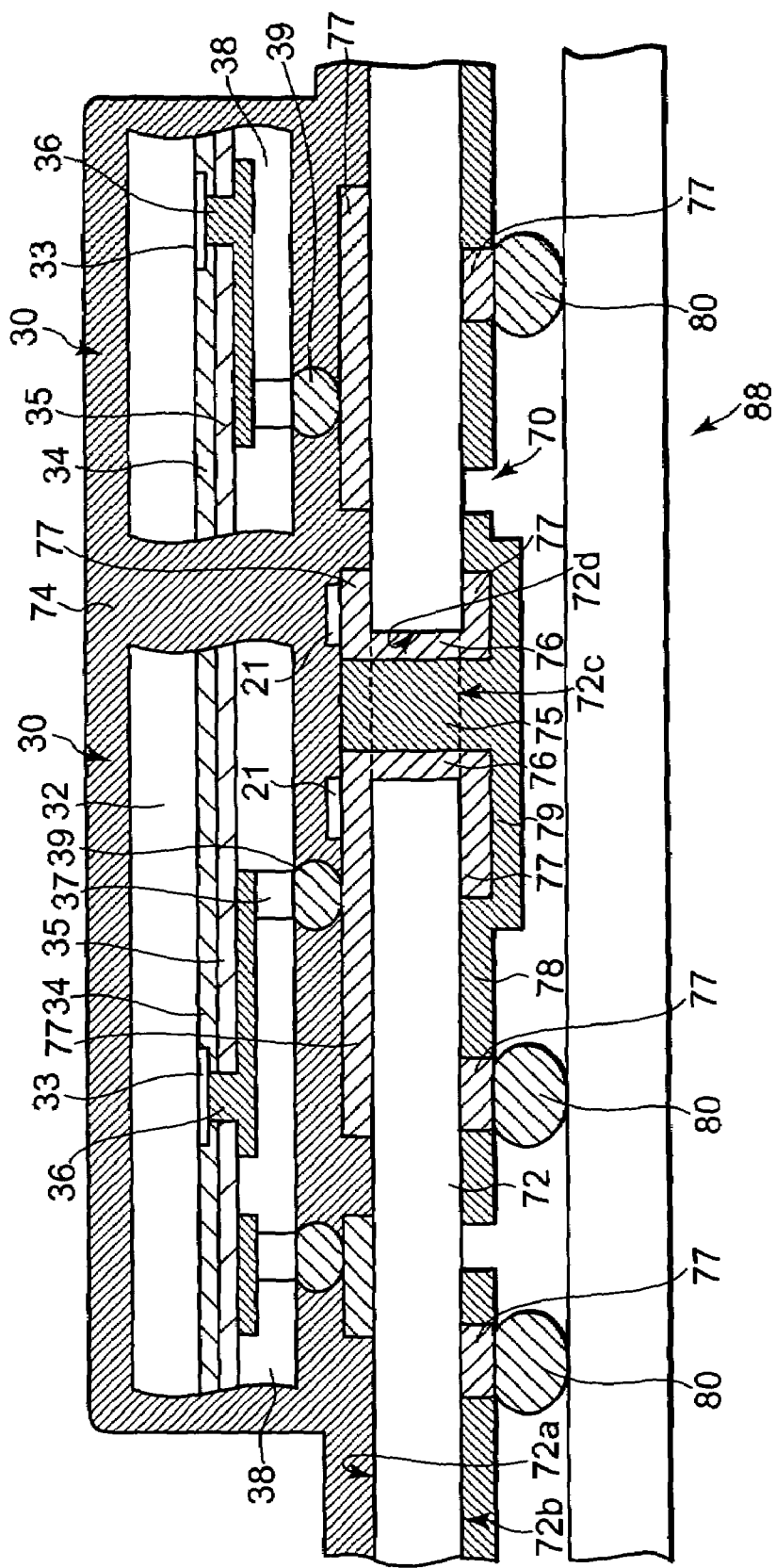
FIG. 5 is a schematic cross-sectional view for describing a second embodiment of the present invention.

Described specifically, as shown in FIG. 5, a plurality of WCSPs each used as a constituent or component parts such as a flash memory are formed on an MCM board 70.

Incidentally, since the structure of the WSCP has already been described in the first embodiment, its description will be omitted.

In the MCM board 70 employed in the present embodiment, second conductive portions 77 are formed by patterning on the obverse and reverse surfaces of a glass epoxy base material 72, i.e., a first main surface 72a and a second main surface 72b.

A through hole 72c, which penetrates between the obverse and reverse surfaces (72a and 72b) of the base material 72, is defined in the base material 72 of the MCM board 70. A first conductive portion 76, which serves as a thermal via portion that shares the use of a conductor wiring, is formed on an inner wall surface 72d of the through hole. Also the first conductive portion 76 is formed so as to be continuous with its corresponding second conductive portions 77 on the first and second main surfaces (72a and 72b).

Then, a first insulating portion 75 higher in thermal emissivity than the first conductive portion 76, is formed on the first conductive portion 76 lying in the through hole 72c. In a manner similar to the first embodiment even here, the first insulating portion 75 has a structure in which it fills up, i.e., buries the interior of a hollow portion defined by the first conductive portion 76 on the inner wall surface of the through hole 72c. A second insulating portion 78 higher in thermal emissivity than the first conductive portion 76 is formed on the second main surface 72b, and a third insulating section 79 higher in thermal emissivity than the first conductive portion 76 is formed on the second main surface 72b with the corresponding second conductive portion 77 interposed therebetween. They are formed continuous with the first insulating portion 75.

In the present configurational example, a heat radiating fourth insulating portion 74 is formed on the whole area of the second main surface 72a of the MCM board 70 so as to cover an electronic part 30.

Further, in the present embodiment, solder balls 80 each used as a second protruded conductive portion, which are mountable on a board or substrate 88 for the motherboard with the MCM board 70 mountable thereon, are formed on the second main surface 72b side of the MCM board 70.

According to the present configuration, the solder ball 80 is connected to its corresponding solder ball 39 through a second conductive portion 77 provided on a main surface 72b of the MCM board 70, a first conductive portion (not shown) provided within a through hole (not shown) of the MCM board 70 and electrically connected to the second conductive portion 77, and a second conductive portion 77 provided on a first main surface 72a and electrically connected to the first conductive portion.

In a manner similar to the first embodiment, the materials for the first, second and third insulating portions (75, 78 and 79) used here may preferably use a coating material containing ceramics, for example. This is because the coating material containing ceramics has a high thermal emissivity of 90% or more in most cases as well as thermal conduction and is capable of realizing high-efficiency heat radiation. Described specifically, alumina ceramics or the like containing $Al_2O_3$ as a major component can be used. One or the like containing such ceramics as described in, for example, Japanese Unexamined Patent Publication No. Hei 10(1998)-279845 can be suitably used at random. Ceramics or the like added with black pigments for improving the thermal emissivity may be used.

According to the present embodiment, as is apparent from the above description, an effect similar to the first embodiment can be obtained.

Further, in the present embodiment, the board having such a heat radiating effect can be applied to an interposer board such as an MCM board capable of mounting other substrate thereon.

Furthermore, according to the present embodiment, the heat radiating insulating portion is formed over the whole surface on the interposer board 70 so as to cover the electronic part. As a result, higher-efficiency heat radiation toward the outside can be realized.

Third Embodiment

A third embodiment of the present invention will be explained with reference to FIG. 6.

The present embodiment is principally different from the first embodiment in that processing for promoting a heat radiating effect is mainly effected on the electronic part side.

Figure 6:
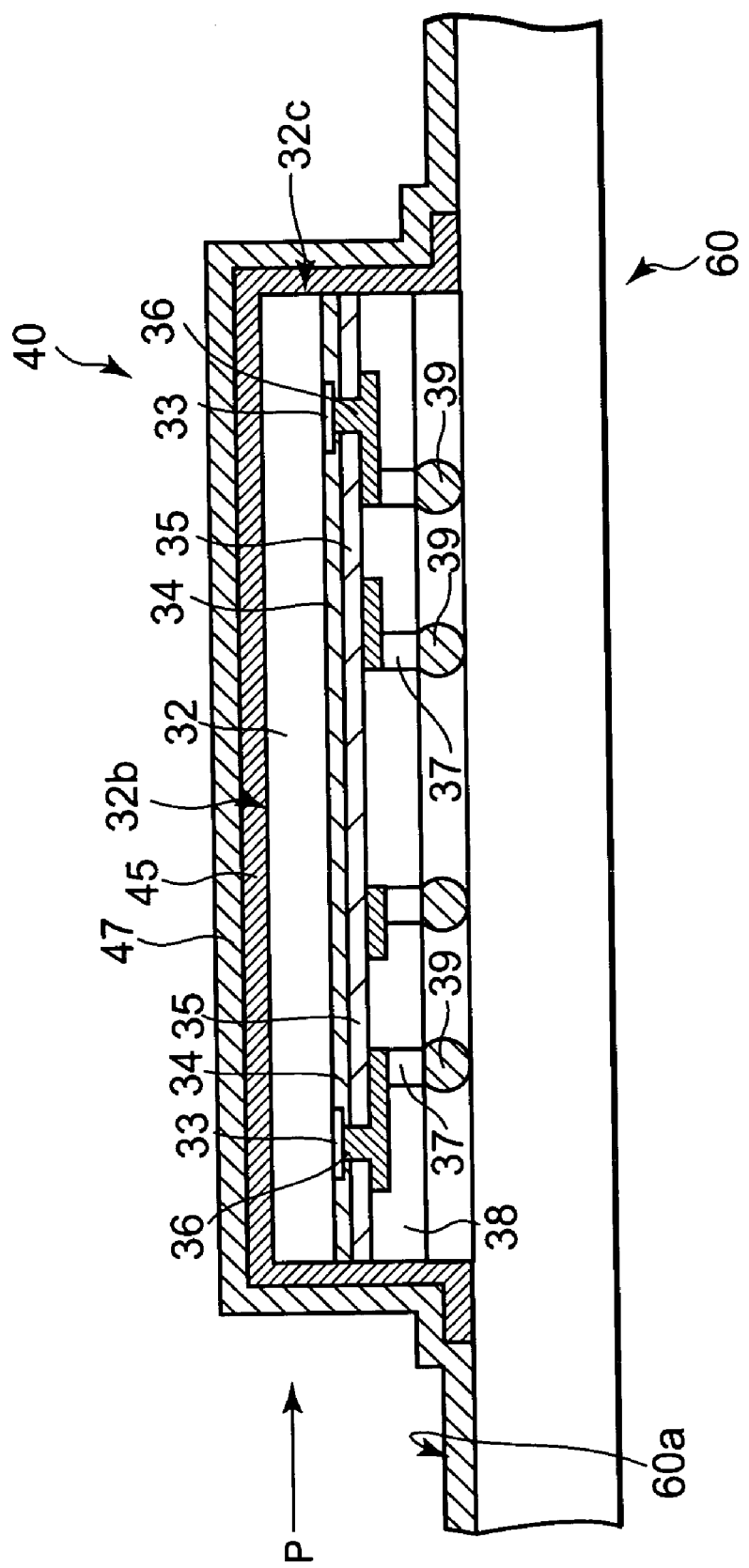
FIG. 6 is a schematic cross-sectional view for describing a third embodiment of the present invention.

As shown in FIG. 6, a principal feature resides in that an electronic part 40 according to the present embodiment includes an auxiliary conductive portion (hereinafter might be called "metal support section") for efficiently transferring heat from the electronic part 40 to a substrate or board 60 with the electronic part 40 mounted thereon. Incidentally, a material such as copper excellent in thermal conduction can be suitably selected at random as for the metal support section 45.

The present embodiment will explain, by way of example, a case in which the electronic part 40 is configured as a WCSP provided with solder balls 39 each used as a substrate mounting protruded conductive portion and the substrate 60 is configured as a printed wiring board.

In the present embodiment, a first feature resides in that as shown in FIG. 6, the metal support section 45 extends from over the surface of the WCSP 40, which is different from the surface on which the solder balls 39 are formed, to a main surface 60a of the substrate, and the length of the metal support section 45 as viewed in its extending direction is equivalent to the length brought into face contact with the main surface 60a of the substrate.

Incidentally, the ends of the metal support section 45 as viewed in the extending direction of the metal support section 45 employed in the present embodiment have shapes bent in the direction non-opposite to the WCSP 40, i.e., in the direction away outside from the WCSP. However, the shapes of the ends thereof are not limited to such shapes. The ends thereof may have portions brought into contact with the main surface 60a of the substrate. Thus, the length of the metal support section 45 as viewed in its extending direction may be such a length or the like that the metal support section 45 extends through the main surface 60a of the substrate 60 and is embedded in the substrate 60. Various shapes can be suitably selected at random according to purpose and design (the details thereof will be described later).

At this time, the metal support section 45 may be provided so as to cover a wide area on an exposed surface of a silicon (Si) substrate 32 constituting a semiconductor chip 32, of the surface of the WCSP 40. This is because heat generated from a silicon surface including a circuit element that serves as a heat generation source can efficiently be transferred to an insulating portion 47 and the substrate 60.

Owing to the provision of such a metal support section excellent in thermal conduction, heat on the back surface (i.e., back surface 32b of the semiconductor chip) and side surfaces (i.e., side surfaces 32c of the semiconductor chip) of the WCSP 40 are promptly transferred to the insulating portion 47 and further transferred even to the substrate 60 promptly. That is, since heat transfer paths between the WCSP 40 and the insulating portion 47 and between the WCSP 40 and the substrate 60 can be reinforced, the heat from the WCSP 40 can reliably be transferred to the substrate 60.

Further, in the present embodiment, a second feature resides in that the infrared emissive insulating portion 47 is formed on the metal support section 45.

In the present configurational example, the infrared emissive insulating portion 47 covers the whole surface of the WCSP 40 including over the metal support section 45 and is formed over the main surface 60*a* of the substrate 60. The insulating portion 47 may take a configuration in which it is formed on the metal support section 45 with a predetermined film thickness. Since, however, the insulating portion is provided in a wide-ranging region including over the metal support section 45 in this way, the area of heat radiation is made larger, thereby making it possible to further promote a heat radiating effect.

In a manner similar to the first embodiment, the material for the insulating portion 47 employed in the present embodiment may also preferably use a coating material containing ceramics, for example. This is because the coating material containing ceramics has a high thermal emissivity of 90% or more in most cases as well as thermal conduction and is capable of realizing high-efficiency heat radiation. Described specifically, alumina ceramics or the like containing $Al_2O_3$ as a major component can be used. One or the like containing such ceramics as described in, for example, Japanese Unexamined Patent Publication No. Hei 10(1998)-279845 can be suitably used at random. Ceramics or the like added with black pigments for improving the thermal emissivity may be used.

The insulating portion 47 can be formed by applying a liquid infrared-emissive insulator coating material to a predetermined area from the main surface 60*a* side of the substrate by, for example, a spray method after the formation of the metal support section 45 on the WCSP 40, and thermally curing it.

Thus, the heat from the WCSP 40, which has been reliably transferred to the substrate 60 through the metal support section 45, can be converted to infrared radiation with high heat emissivity by means of the insulating portion 47 and emitted outside, thereby making it possible to promote a heat radiating effect.

Specific examples each illustrative of the shape of the metal support section 45 will be explained subsequently with reference to FIG. 7. Each of lower stages of FIGS. 7(A) through 7(C) is a schematic cross-sectional view of the structure shown in FIG. 6 as viewed from the direction indicated by arrow P in the figure. Upper stages thereof are developed views of the metal support sections 45 corresponding to the lower stages. Illustrations of infrared emissive insulating portions 47 are omitted here. For the purpose of fixing the metal support section 45 to be described below to the WCSP 40, arbitrary suitable methods such as a method of heating a molded metal support section 45 at a predetermined temperature and welding it to the WCSP 40, etc. can be used.

The metal support section 451 shown in FIG. 7(A) has such a shape as to fully cover the whole surface of the WCSP 40. Although there is a fear of stress concentration due to such a shape, heat generated from the silicon surface can be reliably transferred to the corresponding substrate 60 side. Incidentally, such a shape can be formed by means of an etching process or the like.

The metal support section 452 shown in FIG. 7(B) is different from the metal support section 451 shown in FIG. 7(A) in that it has such a shape as to cover the whole area of a back surface 32*b* of a semiconductor chip 32. Owing to the provision of such a shape, heat generated from the surface of a silicon substrate constituting the semiconductor chip can be transferred to the corresponding substrate 60 with efficiency. Incidentally, such a shape can be formed by means of an etching process or the like.

The metal support section 453 shown in FIG. 7(C) has such a shape as to cover the back surface and side surfaces of a WCSP 40 in a mesh fashion. Since there are formed slits 49 which extend from a main surface 60*a* of a substrate to the WCSP 40, the concentration of stress due to the difference in thermal expansion coefficient, which occurs in the boundary between the substrate 60 and the WCSP 40, can be relaxed. Since such a flat or plate-shaped copper plate including mesh patterns can be relatively easily molded through the use of a die or the like, it is excellent in manufacturing cost.

Specific examples of the shapes of the ends of the metal support sections 45 (451, 452 and 453 (see FIG. 7) or the like), i.e., the ends thereof brought into contact with main surfaces 60*a* of substrates will be explained subsequently with reference to FIG. 8.

Figure 8A:
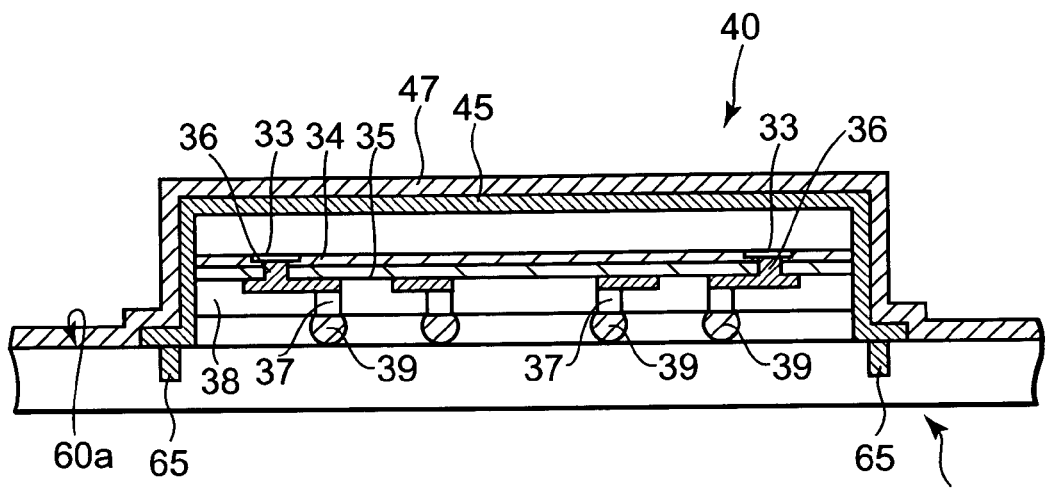
FIG. 8 is a view (part 2) for describing the metal support sections employed in the third embodiment of the present invention.

In FIG. 8(A), connecting pins 65, which extend through a main surface 60*a* of the substrate and are embedded in the substrate 60, are formed at their corresponding ends of the metal support section 45. Owing to the provision of such connecting pins 65, a WCSP 40 mounted on the substrate 60 can be prevented from causing its position displacement due to external shock and maintained in a stable mounted state. The metal support section at this time can be fabricated by, for example, welding connecting pins 65 separately formed of copper to the ends (positions indicated by Q in FIG. 7(A), for example) of the flat copper plate so as to become normal to the copper plate. Then, the connecting pins 65 may be fitted in and fixed to their corresponding pores of the substrate 60, which has previously been formed by, for example, a drill or the like.

Figure 8B:
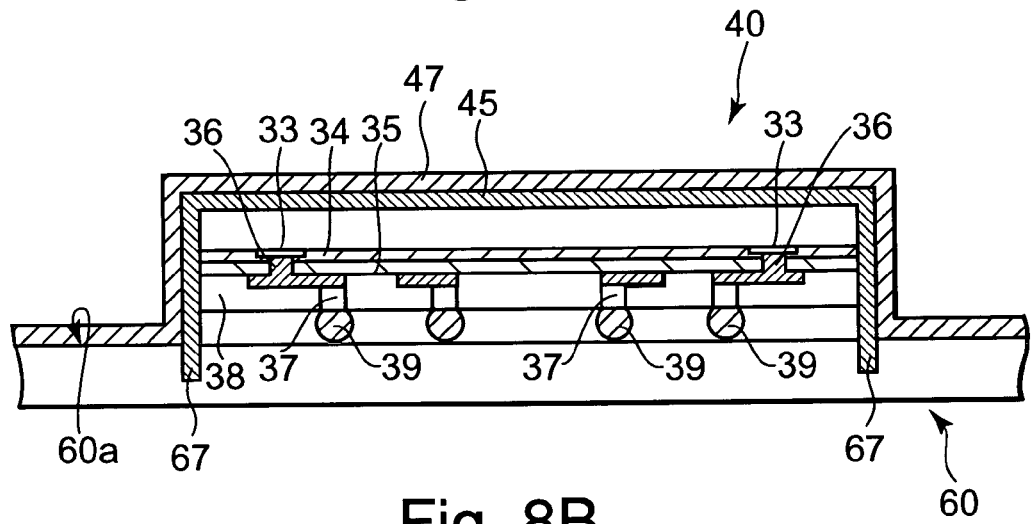

FIG. 8(B) is different from FIG. 8(A) in that the ends per se of the metal support section 45 are respectively connecting pins 67. Since there is no need to weld the connecting pins separately in the case of such a shape, the present example is excellent in manufacturing cost. The support section at this time can be fabricated by processing a flat copper plate in advance in consideration of portions embedded in the substrate 60, which serve as connecting pins. In a manner similar to FIG. 8(A), a stable mounted state can suitably be maintained.

Figure 8C:
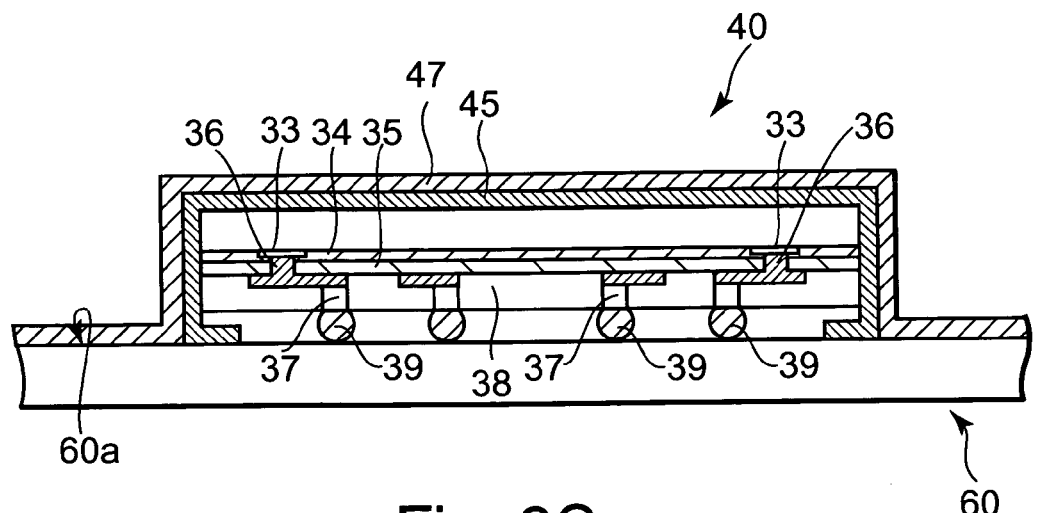

In FIG. 8(C), the ends of the metal support section 45 are respectively bent in the direction opposite to the WCSP 40. Therefore, the present example is excellent in that the suppression of the degree of freedom of wiring design due to the placement of the connecting pins does not occur as compared with the structure that the connecting pins serving as the conductors are embedded therein.

Incidentally, the shapes of the infrared emissive insulating portion and the metal support section are not limited to only the above-described shapes but can be formed in various ways according to purpose and design.

According to the present embodiment, as is apparent from the above description, since a heat transfer path between an electronic part and a substrate can be reinforced owing to the provision of a metal support section, heat produced from the electronic part can reliably be transferred to the substrate.

As a result, the heat reliably transferred to the substrate side can highly efficiently be converted into infrared radiation by the infrared emissive insulating portion 47, followed by being radiated, thereby making it possible to promote a heat radiating effect.

As mentioned above, the present invention is not limited to the aforementioned embodiment alone. Thus, the present invention can be applied by utilizing the above conditions in combination suitably at random.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A substrate for mounting an electronic part thereon, comprising:
    a base body having a first main surface and a second main surface opposite to the first main surface, and a through hole which penetrates from the first main surface to the second main surface;
    a first conductive portion formed on an inner wall surface of the through hole; and
    a first insulating portion which is formed on the first conductive portion and higher in thermal emissivity than the first conductive portion.

2. A substrate according to claim 1, wherein the first insulating portion is filled in the through hole.

3. A substrate according to claim 1, further comprising a second insulating portion higher in thermal emissivity than the first conductive portion is formed on both or either one of the first main surface and the second main surface.

4. A substrate according to claim 1, further comprising:
    a second conductive portion formed on both or either one of the first main surface and the second main surface so as to be connected to the first conductive portion; and
    a third insulating portion which is formed on the corresponding second conductive portion and higher in thermal emissivity than the first and second conductive portions.

5. A substrate according to claim 4, wherein the second and third insulating portions are formed on the main surface opposite to the main surface on which the electronic part is mounted and wherein the first insulating portion, the second insulating portion and the third insulating portions are formed continuously.

6. A substrate according to claim 1, wherein the first insulating portion contains ceramics.

7. A substrate according to claim 6, wherein the ceramics contains $Al_2O_3$ as a major component.

8. A semiconductor device, comprising:
    a base body having a first main surface and a second main surface opposite to the first main surface, and a through hole which penetrates from the first main surface to the second main surface;
    a first conductive portion formed on an inner wall surface of the through hole;
    second conductive portion formed on the first main surface and the second main surface so as to be connected to the first conductive portion;
    an electronic part mounted on the first main surface, said electronic part being electrically connected to the second conductive portion formed on the first main surface;
    a first insulating portion which is formed on the first conductive portion and higher in thermal emissivity than the first conductive portion; and
    an external terminal formed on the second conductive portion provided on the second main surface.

9. A semiconductor device according to claim 8, further comprising a fourth insulating portion which is formed on the first main surface so as to cover a surface of the electronic part and is higher in thermal emissivity than the first and second conductive portions.

10. A semiconductor device according to claim 8, further comprising a second insulating portion which is formed on the second main surface and is higher in thermal emissivity than the first and second conductive portions.

11. A semiconductor device according to claim 8, further comprising a third insulating portion which is formed on the second conductive portion on the second main surface and higher in thermal emissivity than the first and second conductive portions.

12. A semiconductor device according to claim 8, wherein the electronic part has protruded conductive portion each electrically connected to the second conductive portion.

13. A semiconductor device according to claim 12, wherein the electronic part is a semiconductor chip having circuit elements.

14. A semiconductor device according to claim 12, wherein the electronic part is a semiconductor package which includes a semiconductor chip having circuit elements and has the same outer size as that of the semiconductor chip.

15. A semiconductor device according to claim 8, wherein the first insulating portion contains ceramics.

16. A semiconductor device according to claim 15, wherein the ceramics contains $Al_2O_3$ as a major component.

* * * * *